(12) United States Patent
Horikiri et al.

(10) Patent No.: US 9,231,185 B2
(45) Date of Patent: Jan. 5, 2016

(54) METHOD FOR MANUFACTURING A PIEZOELECTRIC FILM WAFER, PIEZOELECTRIC FILM ELEMENT, AND PIEZOELECTRIC FILM DEVICE

(75) Inventors: Fumimasa Horikiri, Nagareyama (JP); Kenji Shibata, Tsukuba (JP); Kazufumi Suenaga, Tsuchiura (JP); Kazutoshi Watanabe, Tsuchiura (JP); Akira Nomoto, Kasumigaura (JP)

(73) Assignee: SCIOCS COMPANY LIMITED, Hitachi-shi, Ibaraki-ken (JP)

( * ) Notice: Subject to any disclaimer, the term of this patent is extended or adjusted under 35 U.S.C. 154(b) by 720 days.

(21) Appl. No.: 13/137,202

(22) Filed: Jul. 27, 2011

(65) Prior Publication Data
US 2012/0025667 A1 Feb. 2, 2012

(30) Foreign Application Priority Data
Jul. 30, 2010 (JP) .................................. 2010-171769

(51) Int. Cl.
| | |
|---|---|
| *H01B 13/00* | (2006.01) |
| *H01L 41/08* | (2006.01) |
| *H05K 3/10* | (2006.01) |
| *H01L 21/67* | (2006.01) |
| *H01L 41/187* | (2006.01) |
| *H01L 41/332* | (2013.01) |
| *H01L 41/314* | (2013.01) |
| *H01L 41/316* | (2013.01) |
| *H01L 41/318* | (2013.01) |

(52) U.S. Cl.
CPC ...... *H01L 41/0805* (2013.01); *H01L 21/67069* (2013.01); *H01L 41/1873* (2013.01); *H01L 41/332* (2013.01); *H05K 3/108* (2013.01); *H01L 41/314* (2013.01); *H01L 41/316* (2013.01); *H01L 41/318* (2013.01); *Y10T 428/24479* (2015.01)

(58) Field of Classification Search
None
See application file for complete search history.

(56) References Cited

U.S. PATENT DOCUMENTS

| | | | | |
|---|---|---|---|---|
| 5,873,977 | A * | 2/1999 | Desu et al. .................. | 505/410 |
| 6,635,185 | B2 * | 10/2003 | Demmin et al. .............. | 216/64 |
| 7,482,736 | B2 | 1/2009 | Ueno et al. | |
| 2003/0166326 | A1 * | 9/2003 | Kikuchi et al. ............... | 438/396 |
| 2004/0196774 | A1 * | 10/2004 | Nam ............................. | 369/126 |

(Continued)

FOREIGN PATENT DOCUMENTS

| | | | |
|---|---|---|---|
| JP | 2005-153353 A | 6/2005 | |
| JP | 2006-294848 A | 10/2006 | |

(Continued)

OTHER PUBLICATIONS

C. M. Kang et al "Etching Characteristics of (Na0.5K0.5)NbO3 Thin Films in an Inductively Coupled Cl2/Ar Plasma", Ferroelectrics, 357, pp. 179-184 (2007).

(Continued)

*Primary Examiner* — Shamim Ahmed
*Assistant Examiner* — Bradford Gates
(74) *Attorney, Agent, or Firm* — McGinn IP Law Group, PLLC (57) ABSTRACT

A method for manufacturing a piezoelectric film wafer includes a first processing step for carrying out an ion etching on a KNN piezoelectric film formed on a substrate by using a gas containing Ar, and a second processing step for carrying out a reactive ion etching by using a mixed etching gas containing a fluorine-based reactive gas and Ar after the first processing step.

11 Claims, 7 Drawing Sheets

(56) References Cited

U.S. PATENT DOCUMENTS

| | | |
|---|---|---|
| 2005/0146772 A1 | 7/2005 | Murata et al. |
| 2007/0035207 A1* | 2/2007 | Kawamura et al. ........... 310/324 |
| 2007/0126313 A1 | 6/2007 | Ueno et al. |
| 2008/0142249 A1* | 6/2008 | Chamberlin et al. ......... 174/255 |
| 2008/0308762 A1 | 12/2008 | Ueno et al. |
| 2009/0189482 A1 | 7/2009 | Shibata et al. |
| 2009/0302715 A1* | 12/2009 | Shibata et al. ................ 310/358 |
| 2010/0013894 A1 | 1/2010 | Ueno et al. |
| 2010/0085499 A1* | 4/2010 | Hirato ............................. 349/39 |
| 2010/0231657 A1* | 9/2010 | Takahashi ....................... 347/68 |

FOREIGN PATENT DOCUMENTS

| | | |
|---|---|---|
| JP | 2007-19302 A | 1/2007 |
| JP | 2007-184513 A | 7/2007 |
| JP | 2008-246789 A | 10/2008 |
| JP | 2009-200469 A | 9/2009 |
| JP | 2009-290367 A | 12/2009 |

OTHER PUBLICATIONS

Notification of Reason(s) for Refusal dated Dec. 17, 2013, with English translation.

\* cited by examiner

METHOD FOR MANUFACTURING A PIEZOELECTRIC FILM WAFER, PIEZOELECTRIC FILM ELEMENT, AND PIEZOELECTRIC FILM DEVICE

The present application is based on Japanese Patent Application No. 2010-171769 filed on Jul. 30, 2010, respectively, the entire contents of which are incorporated herein by reference.

BACKGROUND OF THE INVENTION

1. Field of the Invention

The invention relates to a method for manufacturing a piezoelectric film wafer, a piezoelectric film element and a piezoelectric thin film device.

2. Related Art

A piezoelectric material is processed into various piezoelectric elements in accordance with different purposes, particularly, it has been widely used for functional electronic components such as an actuator for generating deformation by applying voltage or sensor for generating voltage from the deformation of elements in a reverse way, etc.

As the piezoelectric material used for an actuator or a sensor, a lead (Pb)-based dielectric material having large piezoelectric characteristics, especially, $Pb(Zr_{1-x}Ti_x)O_3$-based perovskite-type ferroelectric called as "PZT", has been widely used, and the piezoelectric material is formed by sintering oxide which is generally formed of individual elements.

In recent years, it is desired to develop a lead-free (Pb-free) piezoelectric material from environmental consideration, and thus, potassium sodium niobate (general formula: $(K_{1-x}Na_x)NbO_3$ ($0<x<1$)), hereinafter referred to as "KNN", etc., has been developed. Since the KNN has piezoelectric characteristics comparable to PZT, it is expected as a potential candidate for a Pb-free piezoelectric material. Examples of a Pb-free piezoelectric film with this kind of piezoelectric material are proposed in the JP-A 2007-19302 and JP-A 2007-184513 for example.

SUMMARY OF THE INVENTION

It is possible to manufacture an inkjet printer head or an angular rate sensor with small environmental burden by forming a Pb-free piezoelectric film as a piezoelectric film. In the manufacturing of these devices, it is required a microprocessing (microfabrication) of the piezoelectric film. However, since a microprocessing method for the piezoelectric film having an alkali niobate-based perovskite structure is not established yet, it is hard to apply the alkali niobate-based perovskite structure to an actuator, a sensor, filter devices or MEMS (Micro Electro Mechanical System) device which require microprocessing with high precision.

Accordingly, it is an object of the invention to provide a method for manufacturing a piezoelectric film wafer, a piezoelectric thin film element and a piezoelectric thin film device, by which the microprocessing can be carried out on a piezoelectric film in a short time, and in which the processing can be selectively stopped.

(1) According to a feature of the invention, a method for manufacturing a piezoelectric film wafer comprises:

a first processing step for carrying out an ion etching on a KNN piezoelectric film formed on a substrate by using a gas containing Ar; and a second processing step for carrying out a reactive ion etching by using a mixed etching gas comprising a fluorine-based reactive gas and Ar after the first processing step.

(2) A mixture ratio of the fluorine-based reactive gas and Ar is preferably 1 or more.

(3) An etching rate in the second processing step may be lower than an etching rate in the first processing step.

(4) A mask pattern comprising Ti or Ta may be formed on the piezoelectric film, and the first and second processing steps may be carried out by using the mask pattern.

(5) A ratio of a film thickness of the piezoelectric film to a film thickness of the mask pattern may be 3 or less.

(6) The piezoelectric film may be processed to provide an etching cross section having a taper shape that is gradually enlarged toward a surface of the substrate.

(7) A base layer is formed between the substrate and the piezoelectric film.

(8) The base layer may comprise a Pt layer.

(9) A ratio of a film thickness of the piezoelectric film to a film thickness of the Pt layer may be 15 or less.

(10) The piezoelectric film comprises an alkali niobate-based perovskite structure expressed in a composition formula $(K_{1-x}Na_x)NbO_3$, in which a composition ratio x is $0.4 \leq x \leq 0.7$.

(11) According to another feature of the invention, a piezoelectric film wafer comprises:

a substrate; and a piezoelectric film comprising an alkali niobate-based perovskite structure formed on the substrate, an etching cross section of the piezoelectric film including an inclined portion enlarged toward the outside, the inclined portion containing fluorine.

(12) An inclination angle of the inclined portion may be from 46° to 68°.

(13) According to a still another feature of the invention, a piezoelectric film device comprises:

a substrate;

a piezoelectric film comprising an alkali niobate-based perovskite structure formed on the substrate, an etching cross section of the piezoelectric film including an inclined portion enlarged toward the outside, the inclined portion containing fluorine;

a lower electrode provided between the substrate and the piezoelectric film;

an upper electrode provided on the piezoelectric film; and a voltage applying unit or a voltage detecting unit connected to the upper and lower electrodes.

POINTS OF THE INVENTION

According to the invention, in a first processing step, an ion etching is carried out on a KNN piezoelectric film formed on a substrate by using a gas containing Ar. Thereafter, in a second processing step, a reactive ion etching is carried out by using a mixed etching gas comprising a fluorine-based reactive gas and Ar after the first processing step.

According to this method, it is possible to carry out the microprocessing on the piezoelectric film with high precision. Further, it is possible to provide a piezoelectric film element with high reliability and a less expensive piezoelectric film device.

BRIEF DESCRIPTION OF THE DRAWINGS

Next, the present invention will be explained in more detail in conjunction with appended drawings, wherein.

DESCRIPTION OF THE PREFERRED EMBODIMENT

Next, an embodiment of the present invention will be explained as follows.

Figure 1A:
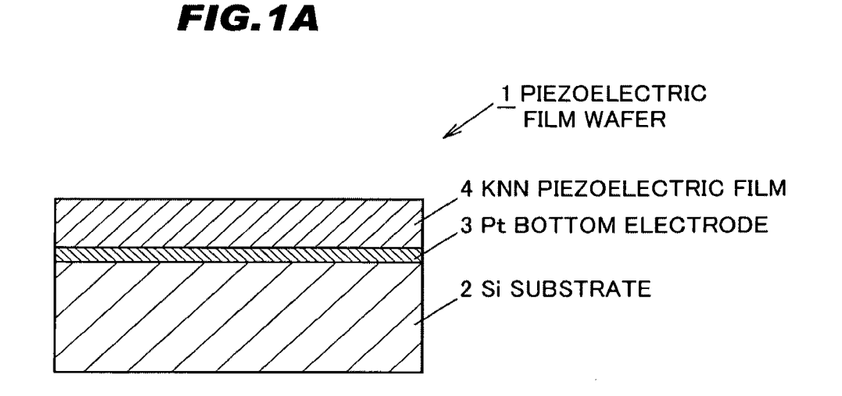
FIG. 1A is a schematic cross sectional view showing a substrate with a piezoelectric film in an embodiment of the invention.

FIG. 1 shows a schematic diagram of a structure of a piezoelectric film wafer 1 in the embodiment according to the invention. The piezoelectric film wafer 1 comprises a silicon (Si) substrate 2. On a top surface of the Si substrate 2, a bottom electrode layer (lower electrode layer) 3 as a base layer is formed. The bottom electrode layer 3 preferably comprises a (111)-oriented platinum (Pt) film (hereinafter, referred to as "Pt bottom electrode layer 3"). A piezoelectric film 4 is formed on the Pt bottom electrode layer 3 formed on the Si substrate 2.

It is necessary to provide the piezoelectric film 4 with an orientation so as to provide the high piezoelectric characteristics. In the piezoelectric film wafer 1 in the present embodiment, the piezoelectric film 4 succeeds the crystal orientation of the Pt bottom electrode layer 3 because of the presence of the Pt bottom electrode layer 3 having a high self-orientation characteristic, so that the piezoelectric film 4 has the (001)-preferred orientation.

This piezoelectric film 4 comprises a thin film of alkali niobate-based perovskite structure expressed in composition formula $(K_{1-x}Na_x)NbO_3$ (hereinafter, referred to as "KNN piezoelectric film 4"). The composition ratio x is $0.4 \leq x \leq 0.7$. In addition, an oxide film ($SiO_2$ film, not shown) may be formed on the surface of the Si substrate 2 so as to electrically insulate the Si substrate 2 from the Pt bottom electrode layer 3.

In the case that a sensor or actuator is manufactured by using the piezoelectric film wafer 1, the KNN piezoelectric film 4 comprising the Pb-free piezoelectric material is processed into a beam-shape or a tuning fork-shape by the microprocessing process. In the microprocessing of this piezoelectric film wafer 1, it is required for conducting the microprocessing with high precision that the KNN piezoelectric film 4 can be processed in a short time and that the processing of the Pt bottom electrode layer 3 can be selectively stopped.

C. M. Kang et al "Etching Characteristics of $(Na_{0.5}K_{0.5})NbO_3$ Thin Films in an Inductively Coupled $Cl_2$/Ar Plasma", Ferroelectrics, 357, pp. 179-184 (2007) discloses that the reactive ion etching is carried out by using Cl-based reactive gas, and Ar gas is mixed to control an etching rate. However, although it is possible to process the KNN piezoelectric film by using the Cl-based reactive gas alone, the Cl-based reactive gas functions as an etching gas for the base layer such as Pt. Therefore, there is a disadvantage in that the etching selectivity (ratio of the etching rates) with respect to the Pt bottom electrode layer cannot be provided, so that it is impossible to carry out the microprocessing with high precision.

As a reactive gas othdr than the Cl-based reactive gas, fluorine-based reactive gas such as $CHF_3$ has been used. However, when the microprocessing of the KNN piezoelectric film is carried out by using the fluorine-based reactive gas alone, the etching rate is low, so that the etching of the KNN piezoelectric film hardly progresses. In addition, when the microprocessing of the KNN piezoelectric film is carried out by using the Ar gas alone, the processing progresses by physical etching caused by Ar ion collision. Therefore, although a desired etching rate can be realized, the etching selectivity of the KNN piezoelectric film to the Pt bottom electrode layer is low.

After zealous studies, the Inventors found that the etching progresses by using a mixed gas in which the fluorine-based reactive gas is mixed with a gas which is capable of the physical etching. Further, the Inventors tried to carry out the microprocessing on the KNN film by combining the physical etching mainly using the Ar gas and the etching mainly using the fluorine-based reactive gas. A lot of samples of the piezoelectric film wafers 1, each of which comprises the Pt bottom electrode layer 3 formed on the Si substrate 2 and the KNN piezoelectric film 4 formed on the Pt bottom electrode layer 3, were manufactured. Thereafter, the reactive ion etching was carried out on the samples with using the mixed gas of Ar and $CHF_3$, and the microprocessing characteristic of the samples was evaluated. As a result, it was found that a mixture ratio of Ar gas and $CHF_3$ gas influenced the etching rate of the KNN piezoelectric film 4 and the etching selectivity of the KNN piezoelectric film 4 to the Pt bottom electrode layer 3.

In the case of the ion etching using the Ar gas mainly, the microprocessing can be carried on the KNN piezoelectric film 4 in a short time. It is assumed that the physical processing by the ion etching using Ar gas is more suitable for the KNN piezoelectric film 4. On the other hand, in the case of using the fluorine-based reactive gas such as $CHF_3$ mainly, it is found that the optimum etching selectivity of the KNN piezoelectric film 4 to the Pt bottom electrode layer 3 is obtained, so that the etching can be easily stopped in the Pt bottom electrode layer 3.

(Formation of the Knn Piezoelectric Film)

The Inventors further studied the relationship between the etching rate and the etching selectivity by changing the kind and the ratio of the fluorine-based reactive gas to be mixed with Ar gas. Next, it will be explained below the formation of the KNN piezoelectric film as well as the relationship between the etching rate and the etching selectivity by the reactive ion etching.

Firstly, the Pt bottom electrode layer 3 is formed on the Si substrate 2 by RF (radio frequency) magnetron sputtering method. In detail, a Ti adhesion layer (not shown) may be formed by sputtering between the Si substrate 2 and the Pt bottom electrode layer 3 at the time of forming the Pt bottom electrode layer 3. The Ti adhesion layer can improve the adhesion between the Si substrate 2 and the Pt bottom electrode layer 3. It is preferable that an arithmetic mean surface roughness Ra of the Pt bottom electrode layer is 0.86 nm or less.

(Formation of a Ti Pattern as a Mask)

Next, a Ti film is formed on the KNN piezoelectric film 4 by the RF magnetron sputtering method. Successively, a photoresist such as OFPR-800 (manufactured by Tokyo Ohka Kogyo Co., Ltd.) is coated on the Ti film, then the photoresist is exposed and developed, to provide a photoresist pattern on the Ti film. The Ti film is etched with a mixed solution of hydrofluoric acid and nitric acid (HF:$HNO_3$:$H_2O$=1:1:50), and the photoresist pattern was cleaned by acetone cleansing, to form a Ti pattern on the KNN piezoelectric film 4. This Ti film is used as an appropriate masking material in the microprocessing of Pb-free piezoelectric film wafer 1, so that it is possible to prevent deterioration in pattern accuracy in the Ar ion etching due to the increase in the mask thickness.

(The Etching Rate and Etching Selectivity by the Reactive Ion Etching)

The microprocessing is carried out on the KNN piezoelectric film 4 by the reactive ion etching using Ar and the reactive gas with the use of the Ti pattern mask.

It is important for carrying out the microprocessing on the KNN piezoelectric film 4 in the piezoelectric film wafer 1 to include a first processing step for carrying out the ion etching with the use of Ar-containing gas, and a second processing step for carrying out the reactive ion etching with the use of a mixed etching gas of Ar gas and reactive gas after the first processing step. In addition, it is preferable to carry out the microprocessing under following condition, although the present invention is not limited to the following condition.

(1) For the second processing step, the ratio of the reactive gas is higher than the ratio of the reactive gas for the first processing step.

(2) For the second processing step, the etching rate is slower than the etching rate in the first processing step.

(3) For the reactive gas, the reactive gas containing the fluorine-based gas such as $CHF_3$, $C_2F_6$, $CF_4$, $SF_6$, $C_4F_8$ is used.

(4) The mixture ratio of Ar/$CHF_3$ gas is 1 or more.

(5) When the first and the second processing stepes are carried out, Ti or Ta is formed as a mask pattern on the KNN piezoelectric film 4.

(6) The ratio of "piezoelectric film thickness/mask pattern thickness" is set to be 3 or less.

(7) The cross section of the etched portion (i.e. etching cross section) in the KNN piezoelectric film 4 has a taper shape that is gradually enlarged toward a surface of the Si substrate 2.

(8) The Pt bottom electrode layer 3 is formed between the Si substrate 2 and the KNN piezoelectric film 4.

(9) The Pt bottom electrode layer 3 having the ratio of "piezoelectric film thickness/bottom electrode layer thickness" of 15 or less is used.

(10) For the second processing step, the etching selectivity of the KNN piezoelectric film 4 to the Pt bottom electrode layer 3 is higher than that in the first processing step.

(11) In the first processing step, the microprocessing is carried out on half or more of the whole film thickness of the KNN piezoelectric film 4, and in the second processing step, the microprocessing is carried out on the remaining part of the KNN piezoelectric film 4.

According to the above condition, the microprocessing can be carried out on the KNN piezoelectric film 4 in a short time, and it is possible to stop the microprocessing in the Pt bottom electrode layer 3 selectively.

Figure 1B:
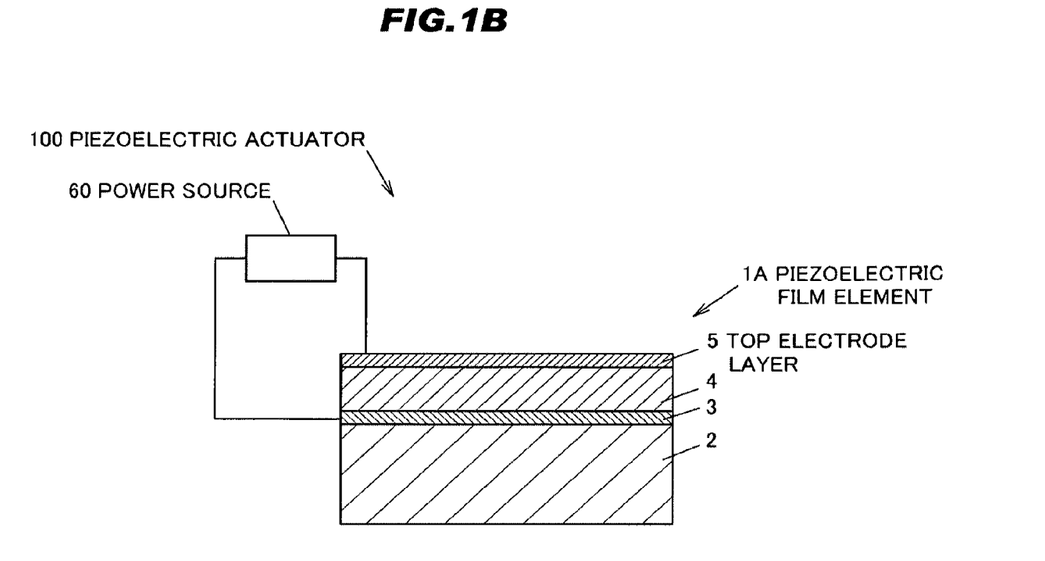
FIG. 1B is an explanatory diagram showing a piezoelectric actuator using an piezoelectric film element in the embodiment of the invention.
Figure 1C:
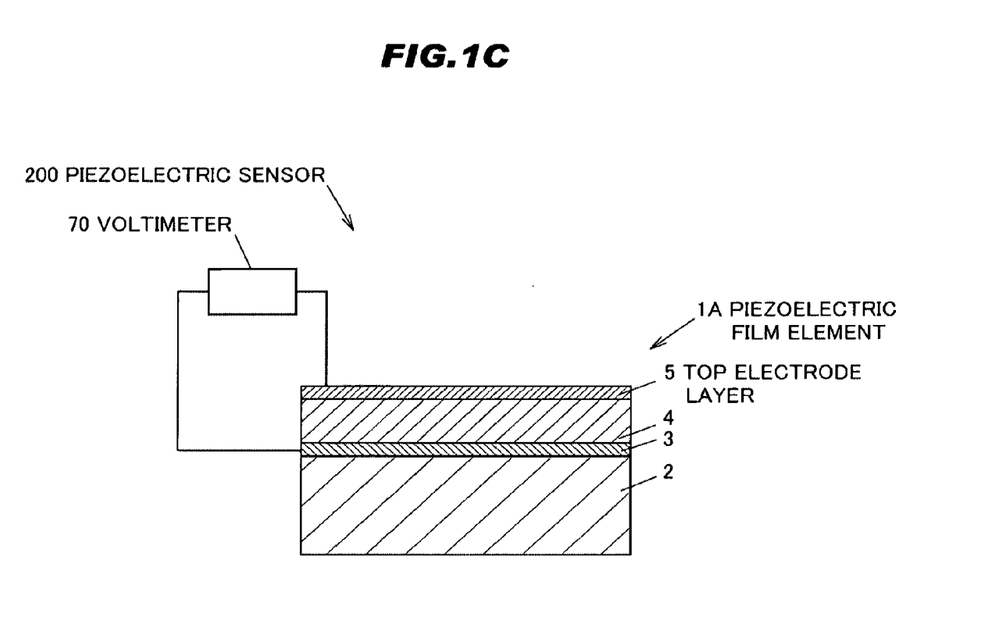
FIG. 1C is an explanatory diagram showing a piezoelectric sensor using the piezoelectric film element in the embodiment of the invention.

FIG. 1B is a cross-sectional view schematically showing a piezoelectric actuator 100 using a piezoelectric film element 1A according to the present invention. FIG. 1C is a cross-sectional view schematically showing a piezoelectric sensor 200 using the piezoelectric film element 1A according to the present invention. Referring to FIGS. 1B and 1C, the upper electrode layer 5 is provided on the KNN piezoelectric film 4. The upper electrode layer 5 may be formed after the microprocessing by the etching, or after removing the Ti film. To simplify the process, the upper electrode layer 5 may be formed on the KNN piezoelectric film 4 before the etching. In this case, the etching is carried out after forming a mask such as Ti on the upper electrode layer 5.

In FIG. 1B, a power source 60 as a voltage applying unit is connected to a top electrode layer (upper electrode layer) 5 and a bottom electrode layer (lower electrode layer) 3 of the piezoelectric element 1A to provide the piezoelectric actuator 100.

In FIG. 1C, a voltimeter 70 as a voltage detecting unit is connected to the upper electrode layer 5 and the lower electrode layer 3 of the piezoelectric element 1A to provide the piezoelectric sensor 200.

EXAMPLES

Next, the piezoelectric film wafer according to the present invention will be explained more concretely in Examples 1 to 7, with referring to FIGS. 1A to 5 and TABLE 1. In the Examples, typical examples of the piezoelectric film wafer are explained, and the present invention is not limited thereto.

(Formation of the KNN Piezoelectric Film)

As a substrate, a Si substrate 2 provided with a thermally-oxidized film ((100) plane orientation, a thickness of 0.525 mm, a thickness of the thermal oxidation film of 200 nm, and a size of 4-inch wafer) was used. Firstly, a Ti adhesion layer (not shown) having a film thickness of 25 nm and a Pt bottom electrode layer 3 having a film thickness of the 220 nm were formed on the Si substrate 2 by the RF magnetron sputtering method. The Ti adhesion layer and the Pt bottom electrode layer 3 were formed under following condition: a substrate temperature of 100° C. to 350° C., a discharge power of 200 W, Ar gas introduced atmosphere, a pressure of 2.5 Pa, and film formation time of 1 to 3 minutes and 10 minutes. In-plane surface roughness of the Pt bottom electrode layer 3 was measured, and the arithmetic mean surface roughness Ra was 0.86 nm or less. It was confirmed that the Pt bottom electrode layer 3 was (111) preferred-oriented by X-ray diffraction measurement. On the Pt bottom electrode layer 3, a ($K_{1-x}Na_x$)$NbO_3$ film was formed by the RF magnetron sputtering method. The ($K_{1-x}Na_x$)$NbO_3$ film (i.e. the KNN piezoelectric film 4) was obtained by forming a film using a sintered body of ($K_{1-x}Na_x$) $NbO_3$ (wherein Na/(K+Na)=0.425 to 0.730) as a target under the following condition: a substrate temperature of 520° C., a discharge power of 700 W, atmosphere of a mixture gas of $O_2$ and Ar with a $O_2$/Ar mixture ratio of 0.005, and a chamber pressure of 1.3 Pa. The film formation time of the KNN piezoelectric film 4 by the sputtering was adjusted such that the thickness of the KNN piezoelectric film 4 is about 3 μm.

So as to confirm the etching selectivity of the KNN piezoelectric film 4 and the Pt bottom electrode layer 3, a sample provided with only the Pt bottom electrode layer 3 having a film thickness of 600 nm to 2 μm was also prepared.

(Formation of Ti Pattern as Mask)

Next, on the KNN piezoelectric film 4, a Ti film with a thickness of about 1.2 μm was formed by the RF magnetron sputtering method. Thereafter, a photoresist such as OFPR-800 was coated on the KNN piezoelectric film 4, and the photoresist was exposed and developed to provide a photoresist pattern on the Ti film. Successively, the Ti film was etched by using the mixed solution of hydrofluoric acid and nitric acid (HF:$HNO_3$:$H_2O$=1:1:50), and the photoresist pattern was cleaned by acetone cleansing, to form a Ti pattern on the KNN piezoelectric film 4.

The microprocessing of the KNN piezoelectric film 4 was carried out by using this Ti pattern as a mask. More concretely, the KNN piezoelectric film 4 was etched by the reactive ion etching (RIE) with the use of a mixture gas of Ar gas and CHF$_3$ gas (Hereinafter, also referred to as "Ar/CHF$_3$ gas") until the Pt bottom electrode layer 3 was exposed, such that a cross sectional shape of the etched portion is a taper shape which is gradually enlarged toward a surface of the Si substrate 2, namely, a trapezoidal shape which is upper-short-lower-long (i.e. an upper side is shorter than a lower side).

Figure 2:
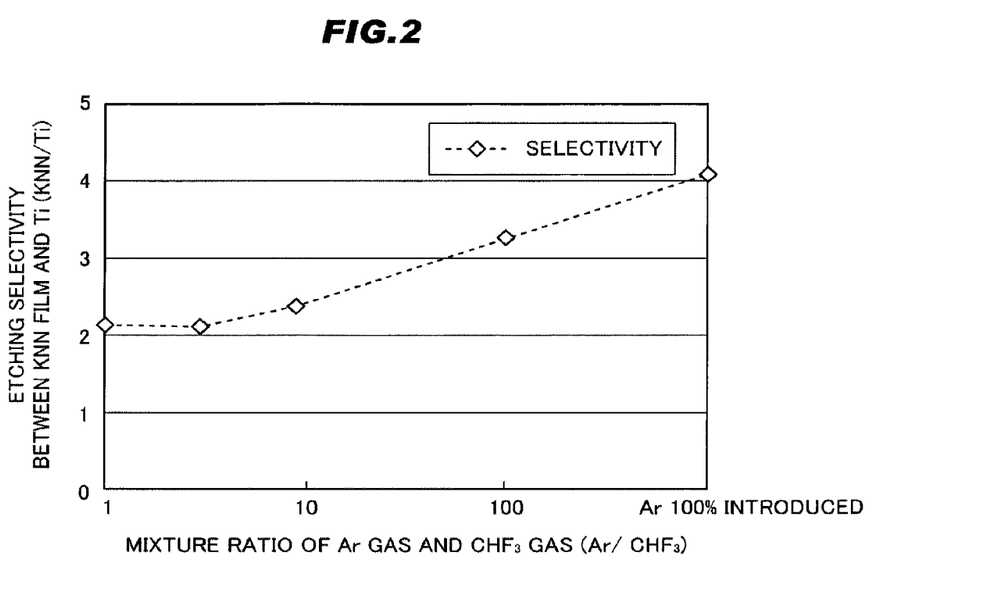
FIG. 2 is a graph showing a relationship between a mixture ratio of Ar gas and $CHF_3$ gas and an etching selectivity of a KNN piezoelectric film to a Ti layer.

FIG. 2 is a graph showing a relationship between the mixture ratio of Ar gas and CHF$_3$ gas and the etching selectivity of the KNN piezoelectric film to the Ti layer. More specifically, FIG. 2 shows the relationship between the mixture ratio and the etching selectivity "piezoelectric film thickness/Ti mask thickness". The etching selectivity is obtained as follows. After the reactive ion etching, the remained Ti pattern is removed by the mixed solution of hydrofluoric acid and nitric acid. Thereafter, a level difference is measured to calculate the etching depth. From the measurement result of the level differences before and after etching, the etching selectivity between KNN and Ti was derived. The etching selectivity "piezoelectric film thickness/Ti mask thickness" (hereinafter, also referred to as "KNN/Ti") is calculated from the etching depth obtained by measuring the level difference and the measurement result of the level difference before and after etching.

As clearly understood from FIG. 2, when the Ar gas was introduced for 100%, the etching selectivity "KNN/Ti" was around 4. When the mixture ratio of Ar/CHF$_3$ gas was within a range from 1:1 to 10:1, the etching selectivity "KNN/Ti" was within a range from about 2.2 to about 2.4. From this result, it is understood that the etching selectivity is reduced by mixing the fluorine-based reactive gas into the Ar gas. Furthermore, from this result, it is understood that a desired etching pattern can be obtained without exposing the piezoelectric film at a region provided with the Ti mask layer, by forming the Ti pattern layer with an appropriate thickness (mask thickness) in accordance with the second processing step of carrying out the etching using the mixed gas, in which a predetermined volume of the fluorine-based reactive gas is introduced into the Ar gas. The ratio of thickness in "KNN/Ti" was set to be 3 or less.

(The Microprocessing by Reactive Ion Etching)

TABLE 1 shows Examples 1 to 7 in which the microprocessing was carried out by the reactive ion etching including the first processing step of etching the KNN piezoelectric film 4 by mainly using the Ar gas in a short time (hereafter, referred to as "the first step"), and the second processing step of stopping the etching in the Pt bottom electrode layer 3 by mainly using CHF$_3$ gas (hereinafter, referred to as "the second step"). The reactive ion etching was carried out under the condition: RF power of 400 W, and a chamber pressure of 33.3 Pa (0.25 Torr). The mixture ratio of Ar/CHF$_3$ gas in the second step was 3:1 and 1:1.

TABLE 1

|  | The first processing step | | | The second processing step | | |
| --- | --- | --- | --- | --- | --- | --- |
|  | Ar [sccm] | Reactive gas/Flow [sccm] | Time [min] | Ar [sccm] | Reactive gas/Flow [sccm] | Time [min] |
| Ex 1 | 100 | —/0 | 70 | 75 | CHF$_3$/25 | 45 |
| Ex 2 | 100 | —/0 | 70 | 50 | CHF$_3$/50 | 55 |
| Ex 3 | 99 | CHF$_3$/1 | 110 | 75 | CHF$_3$/25 | 35 |
| Ex 4 | 99 | CHF$_3$/1 | 110 | 50 | CHF$_3$/50 | 45 |
| Ex 5 | 100 | —/0 | 70 | 75 | C$_2$F$_6$/25 | 60 |
| Ex 6 | 100 | —/0 | 70 | 75 | CF$_4$/25 | 60 |
| Ex 7 | 99 | CHF$_3$/1 | 110 | 75 | SF$_6$/25 | 55 |

(The Etching Rate and Etching Selectivity by the Reactive Ion Etching)

The microprocessing characteristics by the reactive ion etching were evaluated by using the piezoelectric film wafer in which the Ti mask pattern was formed on the KNN piezoelectric film 4.

Figure 3:
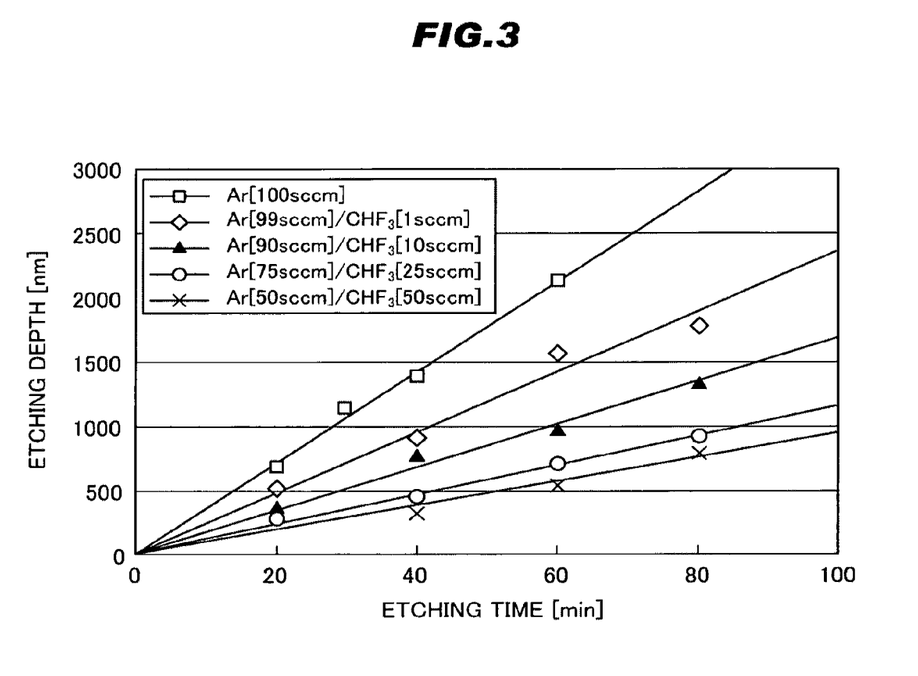
FIG. 3 is a graph showing a relationship between an etching time and an etching depth.

FIG. 3 shows the relationship between the etching time and the etching depth in which the RF power of 400 W, the chamber pressure of 33.3 Pa, and the mixture ratio of Ar/CHF$_3$ gas was varied in five patterns.

As clearly understood from FIG. 3, it is found that the etching rate is increased with increasing in the Ar gas ratio. The maximum etching rate was 2.1 μm/h in the Ar gas etching. In the Ar/CHF$_3$=1:1 mixture gas, the etching rate was 0.56 μm/h.

Figure 4:
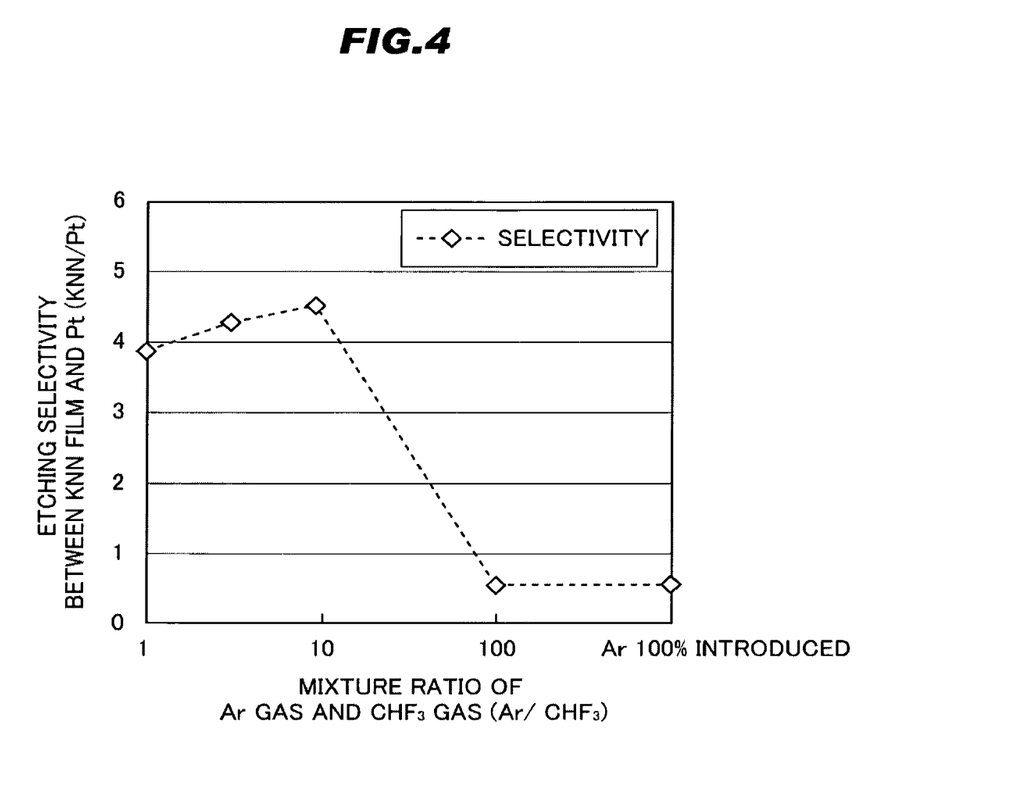
FIG. 4 is a graph showing a relationship between a mixture ratio of Ar gas and $CHF_3$ gas and an etching selectivity of the KNN piezoelectric film to a Pt layer.

Referring to FIG. 4, FIG. 4 shows the relationship between the mixture ratio of the Ar/CHF$_3$ gas obtained by using the sample, in which only the Pt bottom electrode layer 3 having the film thickness of 600 nm to 2 μm was used, and the etching selectivity "KNN piezoelectric film/Pt bottom electrode layer" (hereinafter, also referred to as "KNN/Pt").

As clearly understood from FIG. 4, a high etching selectivity of "KNN/Pt" was obtained when the mixture ratio of Ar/CHF$_3$ gas was within a range of 1:1 to 10:1. The etching selectivity of "KNN/Pt" was around 4.5 at maximum. Different from the masking material, it is sufficient that the Pt bottom electrode layer 3 has such a thickness that can wear the etching, during a processing time from a moment that a part of the Pt bottom electrode layer 3 is exposed until the KNN piezoelectric film 4 is etched to expose an entire part of the Pt bottom electrode layer 3 at a predetermined region. In other words, it is sufficient if the Pt bottom electrode layer 3 has a predetermined thickness without exposing the Si substrate 2 after the second step. In this example, the etching at the second step was carried out without exposing the Si substrate 2 by forming the Pt bottom electrode layer 3 having the thickness of 220 nm while the KNN piezoelectric film 4 has the thickness of 3 μm.

The Inventors found following fact after the studies. Namely, when the mixture ratio of Ar/CHF$_3$ gas in the second step is within the range from 1:1 to 10:1, unevenness of the etching at a wafer surface is small and the etching selectivity is high. Therefore, by using the Pt bottom electrode layer 3 having the ratio "KNN/Pt" of 15 or less, it is possible to selectively etch the piezoelectric film 4 without exposing the Si substrate 2 by the etching at the first and second steps.

In addition, the etching rate was observed by varying the chamber pressure from 20 to 66.7 Pa (from 0.15 to 0.50 Torr) as to the Ar gas. The difference in the etching rate was around 20%. It is confirmed that the etching rate is the highest when the chamber pressure is 33.3 Pa (0.25 Torr). The same tendency was observed when using the fluorine-based reactive gas other than CHF$_3$, e.g. C$_2$F$_6$, CF$_4$, SF$_6$, C$_4$F$_8$.

Figure 5:
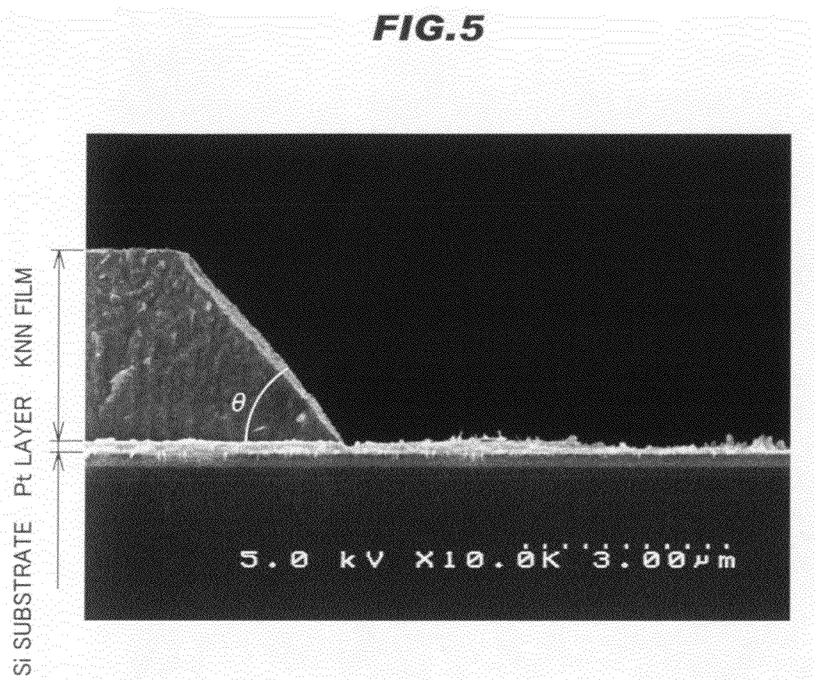
FIG. 5 is a scanning electron microscope (SEM) image showing a cross section of the piezoelectric film wafer.

Referring to FIG. 5, FIG. 5 shows a cross section of the piezoelectric film wafer 1 after the microprocessing in Example 1 shown in TABLE 1. In all of Examples 1 to 7 shown in TABLE 1, it is possible to stop the etching at the Pt bottom electrode layer 3 selectively. As clearly understood from FIG. 5, it is possible to remove only the KNN piezoelectric film 4 and to stop the etching in the Pt bottom electrode layer 3 by combining the first step and the second step.

In the KNN piezoelectric film 4 in Examples 1 to 7 in which the microprocessing including the first and second steps was carried out, a tapered inclined portion which is enlarged toward the outside is formed at the etching cross section which is an interface between a portion with the Ti pattern mask and a portion with no Ti pattern mask. The inclined portion has a trapezoidal shape which is upper-short-lower-long (i.e. an upper side is shorter than a lower side) with a predetermined inclination angle θ. It is assumed that the ratio of the fluorine-based reactive gas is half or less, so that the KNN piezoelectric film 4 is mainly etched by the physical etching.

A taper angle (inclination angle θ) of the KNN piezoelectric film 4 in each of Examples 1 to 7 shown in TABLE 1 is as follows Example 1: 51°, Example 2: 68°, Example 3: 53°, Example 4: 66°, Example 5: 46°, Example 6: 47°, and Example 7: 60°. This taper angle θ is calculated from an angle made by a slope connecting an upper surface edge and a bottom surface edge of the KNN piezoelectric film 4 and a bottom surface of the KNN piezoelectric film 4, and the calculated result is rounded off to unit. In Examples, a bias power was 0 W, and the taper angle can be changed by changing the bias power.

As clearly understood from FIGS. 3 and 4, it is necessary to carry out the ion etching using mainly the Ar gas for the microprocessing on the KNN piezoelectric film 4 in a short time. Further, it is preferable to carry out the etching using mainly the fluorine-based reactive gas such as $CHF_3$, from which the etching selectivity of around 4.5 at maximum for the KNN piezoelectric film 4 is provided, to stop the etching in the Pt bottom electrode layer 3. However, when the mixture ratio of Ar/$CHF_3$ gas is smaller than 1, the etching rate of the KNN piezoelectric film 4 falls greatly, so that it is not suitable for the actual microprocessing. Therefore, it is preferable that the mixture ratio of Ar/$CHF_3$ gas is 1 or more.

In the case of the ion etching with the use of the Ar gas, it is possible to obtain the etching selectivity of around 3 to 4 for the KNN piezoelectric film 4 because of the Ti pattern used as a mask. On the other hand, in the case of using the reactive gas mainly containing $CHF_3$, the etching selectivity for the KNN piezoelectric film 4 is only around 2.2 to 2.5 because of the Ti pattern used as a mask. Therefore, it is preferable to process half or more of the KNN piezoelectric film 4 by the first step.

When the KNN piezoelectric film 4 is formed on the Pt bottom electrode layer 3 having the arithmetic mean surface roughness Ra greater than 0.86 nm to provide the piezoelectric film wafer 1, while the KNN piezoelectric film 4 wears as a piezoelectric device, the piezoelectric characteristic of the KNN piezoelectric film 4 deteriorated. Therefore, so as to obtain a sufficient piezoelectric characteristic of the KNN piezoelectric film 4, it is preferable that the arithmetic mean surface roughness Ra of the Pt bottom electrode layer 3 is 0.86 nm or less.

The piezoelectric film wafer of the present invention is explained with referring to the embodiments and Examples of the present invention, however, the present invention is not limited thereto. As clearly understood from the above description, the present invention can be embodied in various embodiments without going beyond its scope. For example, following variations may be embodied.

(First Variation)

In the Examples, the film thickness of the KNN piezoelectric film 4 is 3 μm. Samples in which the film thickness of the Pt bottom electrode layer 3 is changed to 200 nm and 250 nm and the film thickness of the Ti mask pattern is changed to 1.0 μm and 2.5 μm were manufactured, and the microprocessing was carried out under the condition same as that in Example 1 of TABLE 1. In all samples, the etching can be selectively stopped in the Pt bottom electrode layer 3. Further, the taper angle θ of the inclined portion of the piezoelectric film wafer 1 was within a range from 50° to 53°.

(Second Variation)

The film thickness of the KNN piezoelectric film 4 is changed to 1 μm, 2 μm, and 5 μm, respectively. The film thickness of the Pt bottom electrode layer 3 is changed to 75 nm, 150 nm, and 350 nm, respectively. The film thickness of the Ti mask pattern is changed to 400 nm, 800 nm, and 2000 nm, respectively. Thereafter, the microprocessing was carried out under the condition same as that in Example 1 of TABLE 1. In all samples, the etching can be selectively stopped in the Pt bottom electrode layer 3, and a desired piezoelectric film wafer 1 can be obtained. When a Pt single layer is used as the bottom electrode layer, it is preferable that the film thickness does not exceed 500 nm. If the film thickness of the Pt bottom electrode layer 3 is greater than 500 nm, it will be difficult to provide the Pt layer with a preferred orientation (111).

When the film thickness of the KNN piezoelectric film 4 is not greater than 1 μm, the fluorine-based reactive gas is mixed in the first step as shown in TABLE 1. For the fluorine-based reactive gas, it is possible to carrying out the reactive ion etching by setting the ratio of $CHF_3$ in the first step to be the same as that in the second step, and continuing the microprocessing without changing the mixture ratio of $CHF_3$. Alternatively, it is possible to continue the microprocessing with changing the mixture ratio of $CHF_3$. A pressure in a reactor and a power may be determined appropriately.

By controlling the etching rate under this condition, it is possible to carry out the microprocessing on the KNN piezoelectric film 4 with good controllability, even though the film thickness of the KNN piezoelectric film 4 is thin. The etching was carried out on the KNN piezoelectric films 4 each having the thickness of 200 nm and 500 nm. As a result, it was confirmed that a desired processing accuracy was obtained without any problem in the etching selectivity.

(Third Variation)

(Processing of the Knn Piezoelectric Film Formed by a Sol-Gel Method)

In the case of forming a piezoelectric material layer by a sol-gel method or MOD (Metal Organic Deposition) method, a coating layer is formed by using precursor liquid in which a composition ratio of the material is adjusted to provide a desired composition formula, and the coating layer is crystallized, to provide a piezoelectric film. For example, a sodium ethoxide is used as an organometallic compound containing Na, potassium ethoxide is used as an organometallic compound containing potassium, and niobium ethoxide is used as an organometallic compound containing niobium, and these materials are mixed to provide a desired mole ratio. Thereafter, the mixed material is dissolved and dispersed by using an organic solvent such as ethyl alcohol, to manufacture the precursor solution.

In the third variation, the precursor solution manufactured by mixing the potassium ethoxide, sodium ethoxide, and niobium ethoxide at the predetermined mole ratio is coated by a spin coat method on a Nb-doped $SrTiO_3$ substrate provided with a Pt layer having a thickness of 100 nm as a base layer, then, dried and partially baked (sintered) on a hot plate.

Thereafter, an annealing process is carried out at a temperature of 700° C. to 800° C. This process is repeated to form a KNN piezoelectric film having a thickness of 1.5 μm.

A Ta film having a film thickness of 1.3 μm is formed as a mask on the KNN piezoelectric film formed by the sol-gel method. Thereafter, the microprocessing of the present invention was carried out on the KNN piezoelectric film. The etching can be selectively stopped in the Pt layer similarly to the piezoelectric film formed by the sputtering method. Further, the taper angle θ of the inclination angle of the piezoelectric film thus obtained is within the range similar to that in the above embodiment.

(Fourth Variation)

(Processing of a KNN Piezoelectric Film Formed by AD Method)

Next, the microprocessing on a KNN piezoelectric film formed by aerosol deposition method (AD method) is examined. The KNN piezoelectric film is formed by using material powders with the same composition ratio as the composition of a desired KNN piezoelectric film as a main material and a helium gas as a carrier gas. In addition, a crystalline powder of a dielectric material which is easily formed by the aerosol deposition method may be mixed as an auxiliary material. Around 3 to 10% by weight ratio of the auxiliary material may be added to the main material.

In the fourth variation, a material, in which $Al_2O_3$ is mixed as the auxiliary material with a material powder of "K:Na:Nb:O=7.5:6.5:16:70 (% by atom number) as the main material, is used. Spray coating is carried out at a substrate temperature of 500° C. to form a KNN piezoelectric film having a thickness of 10 μm. A Si substrate provided with a Pt layer having a thickness of 150 nm is used as the substrate.

A W (tungsten) film having a film thickness of 1.3 μm is formed as a mask on the KNN piezoelectric film formed by the AD method. Thereafter, the microprocessing of the present invention was carried out on the KNN piezoelectric film. The etching can be selectively stopped in the Pt layer similarly to the piezoelectric film formed by the sputtering method. Further, the taper angle θ of the inclination angle of the piezoelectric film thus obtained is within the range similar to that in the above embodiment.

(Other Variations)

For the electrode, an electrode material generally used in a semiconductor process can be used. Although Ti is used as a mask in the embodiment, the similar microprocessing can be carried out by using Ta (tantalum) and W (tungsten) instead of Ti.

In the above embodiment, the Ti adhesion layer is formed between the Si substrate 2 and the Pt bottom electrode layer 3. Ta may be used instead of Ti. In the case of using no adhesion layer, it is possible to provide the same effect as that in the embodiment by controlling the plane orientation of the Pt bottom electrode layer 3.

As to the substrate, although the (001) plane Si substrate 2 with a thermally-oxidized film (001) is used in the embodiment, it is possible to provide the same effect as that in the embodiment by using a Si substrate with different plane orientation, a Si substrate without thermally-oxidized film, or a SOI (Silicon-On-Insulator) substrate. Further, instead of the Si substrate, a quartz substrate, a GaAs substrate, a sapphire substrate, a metallic substrate such as stainless substrate, a MgO substrate, or a $SrTiO_3$ substrate may be used. Although the KNN piezoelectric film 4 is not doped in the embodiment, the KNN piezoelectric film 4 may be doped with 5% or less by atom number of Li (lithium), Ta, Sb (antimony), Ca (calcium), Cu (copper), Ba (barium), Ti and the like.

By using the method for manufacturing a piezoelectric film wafer 1, it is possible to obtain a piezoelectric film element which can be applied to the actuator, sensor, filtering device, or a MEMS device. Further, it is possible to manufacture a piezoelectric film device provided with a voltage detecting means or a voltage applying means with the reliability similar to that of the conventional device and the less expensive manufacturing cost. The actuator using the piezoelectric film element may be used for an inkjet printer head, a scanner, an ultrasonic generator, and the like. The sensor using the piezoelectric film element may be used for an angular rate sensor, an ultrasonic sensor, a pressure sensor, a speed sensor, an acceleration sensor.

Although the invention has been described with respect to the specific embodiment for complete and clear disclosure, the appended claims are not to be therefore limited but are to be construed as embodying all modifications and alternative constructions that may occur to one skilled in the art which fairly fall within the basic teaching herein set forth.

What is claimed is:

1. A method for manufacturing a piezoelectric film wafer, comprising:
   forming a mask pattern on a film wafer comprising a substrate, a base layer provided on the substrate, and a piezoelectric film comprising potassium sodium niobate (KNN) and being provided on the base layer;
   a first processing for carrying out an ion etching on the piezoelectric film through the mask pattern by using a first etching gas; and
   a second processing for carrying out a reactive ion etching through the mask pattern by using a second etching gas after the first processing,
   wherein an etching selectivity of the piezoelectric film to the mask pattern by the first etching gas is greater than an etching selectivity of the piezoelectric film to the base layer by the first etching gas,
   wherein an etching selectivity of the piezoelectric film to the base layer by the second etching gas is greater than an etching selectivity of the piezoelectric film to the mask pattern by the second etching gas, and
   wherein the first etching gas comprises Ar, and the second etching gas comprises Ar and a fluorine-based reactive gas.

2. The method for manufacturing a piezoelectric film wafer according to claim 1, wherein a mixture ratio of Ar to a fluorine-based reactive gas (Ar/fluorine-based reactive gas) in the second etching gas is 1 or more and 10 or less.

3. The method for manufacturing a piezoelectric film wafer according to claim 1, wherein an etching rate in the second processing is lower than an etching rate in the first processing.

4. The method for manufacturing a piezoelectric film wafer according to claim 1, wherein the mask pattern comprises Ti or Ta.

5. The method for manufacturing a piezoelectric film wafer according to claim 4, wherein a ratio of a film thickness of the piezoelectric film to a film thickness of the mask pattern is 3 or less.

6. The method for manufacturing a piezoelectric film wafer according to claim 1, wherein the piezoelectric film is processed to provide an etching cross section having a taper shape that is gradually enlarged toward a surface of the substrate.

7. The method for manufacturing a piezoelectric film wafer according to claim 1, wherein the base layer comprises a Pt layer.

8. The method for manufacturing a piezoelectric film wafer according to claim 7, wherein a ratio of a film thickness of the piezoelectric film to a film thickness of the Pt layer is 15 or less.

9. The method for manufacturing a piezoelectric film wafer according to claim 1, wherein the piezoelectric film comprises an alkali niobate-based perovskite structure expressed in a composition formula expressed in a composition formula $(K_{1-x}Na_x)NbO_3$, wherein a composition ratio x is $0.4 \leq x \leq 0.7$.

10. A method for manufacturing a piezoelectric film wafer including a substrate, a base layer comprising Pt and formed on the substrate, and a piezoelectric film formed on the base layer, the method comprising:

forming a mask pattern comprising Ti, Ta or W on the piezoelectric film;

first etching the piezoelectric film through the mask pattern by using a first etching gas comprising Ar; and after the first etching of the piezoelectric film, second etching the piezoelectric film through the mask pattern by using a second etching gas comprising Ar and a fluorine-based reactive gas, wherein the piezoelectric film comprises an alkali niobate-based perovskite structure expressed in composition formula $(K_{1-x}Na_x)NbO_3$, where a composition ratio x is in range of $0.4 \leq x \leq 0.7$.

11. The method for manufacturing a piezoelectric film wafer according to claim 10, wherein an etching selectivity of the piezoelectric film to the mask pattern by the first etching gas is greater than an etching selectivity of the piezoelectric film to the base layer by the first etching gas, and an etching selectivity of the piezoelectric film to the base layer by the second etching gas is greater than an etching selectivity of the piezoelectric film to the mask pattern by the second etching gas.

* * * * *